United States Patent [19]

Ishikawa et al.

[11] 4,112,418
[45] Sep. 5, 1978

[54] LIGHTNING CURRENT RESPONSIVE ALARM

[75] Inventors: Toshio Ishikawa; Jun Ozawa; Masaoki Tamura, all of Hitachi, Japan

[73] Assignee: Hitachi, Ltd., Japan

[21] Appl. No.: 766,568

[22] Filed: Feb. 7, 1977

[30] Foreign Application Priority Data

Feb. 25, 1976 [JP] Japan .................................. 51-18921

[51] Int. Cl.² .......................... G08B 21/00; H02H 9/06
[52] U.S. Cl. .................................... 340/659; 340/664; 361/118
[58] Field of Search .............. 340/248, 253; 325/362; 324/72; 361/117, 118, 111

[56] References Cited

U.S. PATENT DOCUMENTS 1,062,083  5/1913  Creighton ....................... 340/248 C Primary Examiner—John W. Caldwell, Sr.
Assistant Examiner—Daniel Myer
Attorney, Agent, or Firm—Craig & Antonelli

[57] ABSTRACT

A lightning current responsive alarm device in which an earthed discharge current circuit consisting of a parallel combination of a non-linear resistor and an inductive impedance element is connected between a protective coordination gap in a power transmission system and earth. In the device, a capacitor is charged up with the drop voltage appearing across the nonlinear resistor, and a sensor or counter is actuated by the discharge current of the capacitor, so that the device can operate with a greatly widened operating range which covers a large current region of lightning current.

14 Claims, 8 Drawing Figures

LIGHTNING CURRENT RESPONSIVE ALARM

BACKGROUND OF THE INVENTION

1. Field of the Invention

This invention relates to lightning current responsive alarm devices, and more particularly to a device of the kind above described which is suitable for alarming the operation of a protective coordination gap across which lightning current of large value flows to be shorted to earth.

2. Description of the Prior Art

Lightning current responsive alarm devices employed hitherto with lightning arresters have generally had a structure as shown in FIG. 2. Referring to FIG. 2 showing the prior art structure designated generally by the numeral 10, a plurality of series-connected non-linear resistors R1 and R2 are connected in parallel with an air gap G, and the parallel connection of the non-linear resistors R1, R2 and air gap G is connected between earth and a protective coordination gap or lightning arrester A disposed in a power transmission system. A capacitor C and a counter coil CC of a sensor or counter 20 are connected in parallel with one of the plural non-linear resistors, for example, the resistor R2. Such a lightning current responsive alarm device is disclosed in, for example, Japanese Utility Model Publication No. 8042/1959 which has been granted as Utility Model Registration No. 501176.

In the prior art structure shown in FIG. 2, the non-linear resistors R1 and R2 are of the kind having relatively little non-linearity, and the air gap G is arranged to conduct the follow current. Therefore, the correlation between the drop voltage appearing across the non-linear resistors R1, R2 and the gap length of the air gap G has been such as to limit the alarmable range of lightning current to a narrow one as described later, and the alarm device has been unable to satisfactorily provide an alarm up to a large current region of scores of thousands of amperes. Further, the prior art lightning current responsive alarm device has been defective in that it is not capable of reliably responding to a follow current such as an oscillatory follow current produced as a result of induction between conductors of electric power lines. The prior art alarm device has also been defective in that the useful life of the air gap G tends to be excessively shortened by being impaired by the short-circuit follow current which has a large current value of order of thousands of amperes among various kinds of follow currents.

FIG. 3 shows the operating performance of the prior art lightning current responsive alarm device shown in FIG. 2. Referring to FIG. 3, the curve G1 represents the operating performance observed when the gap length of the air gap G is set at such a value that discharge can take place at the minimum operating current level of the counter 20. In such a case, a relatively slight increase in the current value results in a great increase in the drop voltage across the non-linear resistors R1 and R2, and the resultant drop voltage is as high as several times that corresponding to the minimum operating current level of the counter 20. As a results, the input voltage Va applied to the capacitor C connected to the connection point of the non-linear resistors R1 and R2 in parallel with the counter coil CC is cut off in a short period of time due to the presence of the air gap G and fails to attain the level which is sufficient to provide the maximum input voltage Vo for the counter 20. Thus, the input voltage Va drops abruptly as seen in FIG. 3, with the result that the operating current region of the counter 20 is limited to a very narrow one as shown by A1. The input voltage Va applied to the capacitor C drops similarly abruptly, and the operating current region of the counter 20 is similarly limited to a very narrow one as shown by A2 in FIG. 3 when the gap length of the air gap G is set at another value as represented by the curve G2. It will thus be seen that the operating current region of the counter 20 is limited to a very narrow range which is dependent on the gap length of the air gap G. Impossibility of extensive widening of the operating current region of the counter 20 has been experimentally confirmed. This is principally because an excessive increase in the gap length of the air gap G is undesirable in that the counter 20 cannot measure the lowest possible minimum operating current, and the maximum input voltage Vo of the counter 20 will be exceeded.

SUMMARY OF THE INVENTION

It is an object of the present invention to eliminate the aforementioned defects of the prior art lightning current responsive alarm device.

Another object of the present invention is to provide a novel and improved lightning current responsive alarm device which is capable of satisfactorily operating even in a large current region.

Still another object of the present invention is to provide an economically advantageously usable alarm device of the kind above described in which a zinc oxide resistance element operable with a very low rate of drop voltage increase up to a large current region is employed as a non-linear resistor so as to reduce the breakdown voltage and current capacity of elements such as a capacitor and a counter connected in parallel therewith.

According to one aspect of the present invention which attains these objects, a zinc oxide resistance element operable with a very low rate of drop voltage increase up to a large current region is employed as a non-linear resistor, and an inductive impedance element is connected in parallel with this zinc oxide resistance element, whereby to establish a path of lightning current and a path of follow current respectively.

According to another aspect of the present invention, a capacitor is used to provide the input voltage to a counter coil by dividing the drop voltage appearing across the zinc oxide resistance element, so that the counter input voltage can be easily regulated to meet the breakdown voltage limit and desired operating current region of the counter.

According to still another aspect of the present invention, the voltage obtained by dividing the drop voltage by the capacitor is converted into a full-wave rectified form before being applied to the counter coil, so that the counter input voltage can be maintained stable against all kinds of oscillatory lightning currents.

The above and other objects features and advantages of the present invention will become apparent from the following detailed description of preferred embodiments thereof taken in conjunction with the accompanying drawings.

DESCRIPTION OF THE PREFERRED EMBODIMENTS

Figure 1:
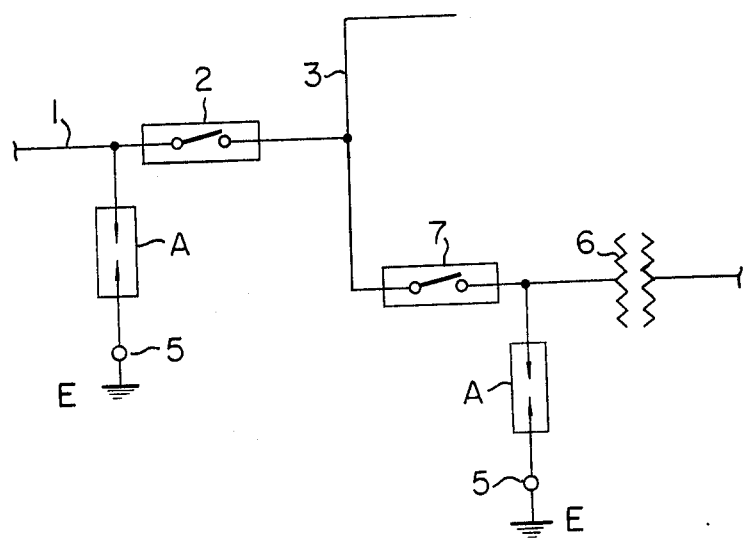
FIG. 1 is a skeleton diagram showing the location of the lightning current responsive alarm device according to the present invention.
Figure 2:
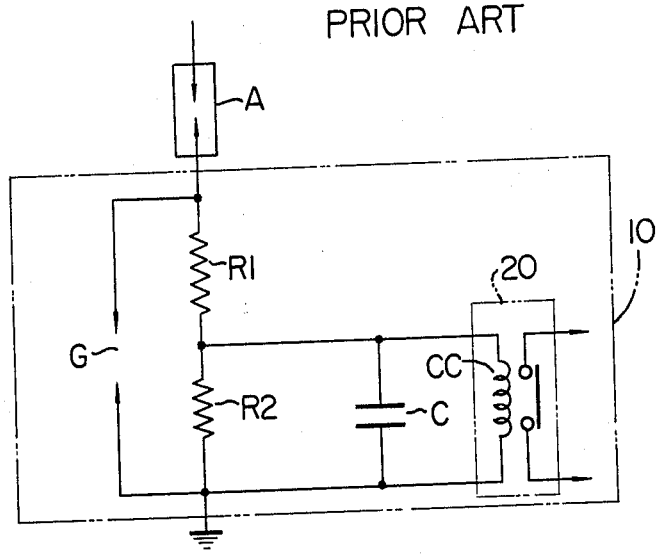
FIG. 2 is a circuit diagram of a prior art lightning current responsive alarm device.
Figure 3:
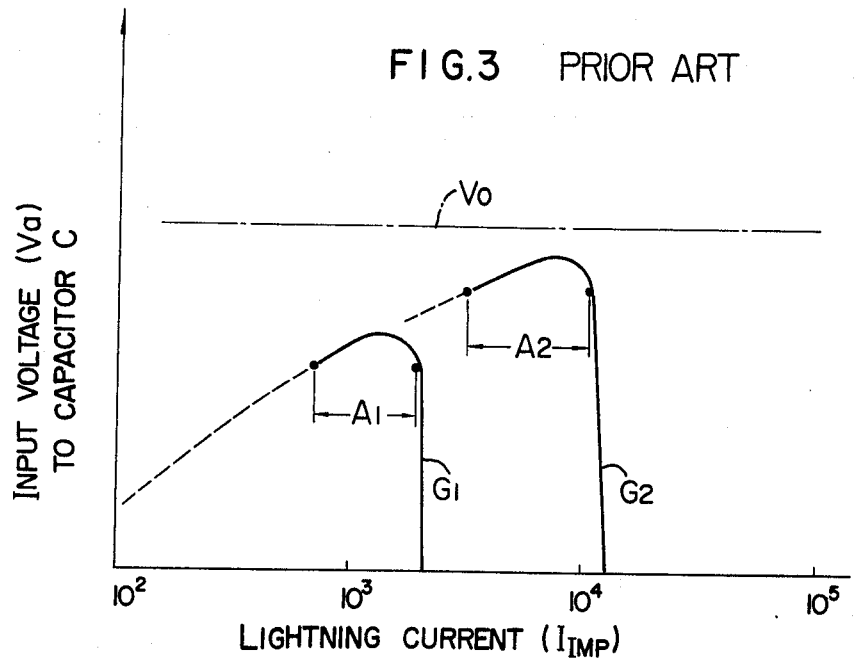
FIG. 3 shows the relation between the gap length of the air gap and the operating current region of the counter shown in FIG. 2, in which the vertical axis represents the voltage Va charging the capacitor C connected in parallel with the counter coil CC in the prior art alarm device, and the horizontal axis represents the lightning current $I_{IMP}$.

Referring to FIG. 1, there is shown the location of the lightning current responsive alarm device according to the present invention. A line circuit breaker 2 is connected between an electric power line 1 and a busbar 3 in an electric power sub-station. A lightning current responsive alarm device 5 provided for detecting and alarming the operation of a protective coordination gap A is connected in series with the protective coordination gap A between the input side of the circuit breaker 2 and earth for the purpose of protecting the circuit breaker 2 against a lightning stroke voltage. Another circuit breaker 7 is provided in each of a plurality of lines extending from the busbar 3 toward transformers 6 in the electric power sub-station, and another protective coordination gap A and another lightning current responsive alarm device 5 similar to those above described are connected in series between the output side of the circuit breaker 7 and earth.

Figure 4:
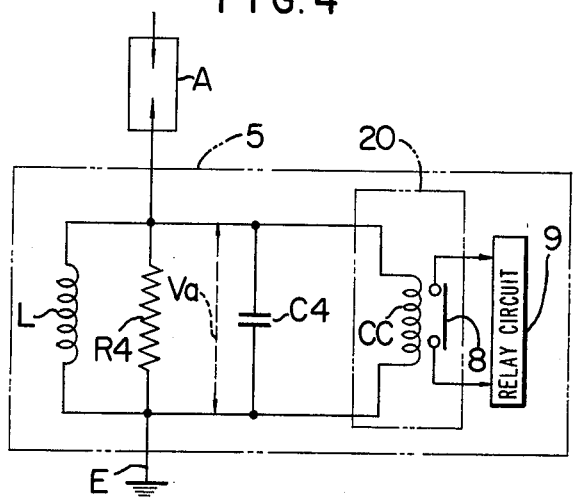
FIGS. 4, 5, 6 and 7 are circuit diagrams of a first, a second, a third and a fourth embodiment respectively of the present invention.

FIG. 4 shows the structure of a first embodiment of the alarm device according to the present invention. Referring to FIG. 4, a non-linear resistor R4 consisting essentially of zinc oxide and operable with a very low rate of drop voltage increase up to a large current region is connected between the protective coordination gap or lightning arrester A and earth E. Such a resistor may be the one disclosed in U.S. Pat. No. 3,663,458.

Connected in parallel with the resistor R4 is an inductive impedance element such as a coil L which has a low impedance against a low frequency but turns out to exhibit a high impedance against a high frequency. Connected also in parallel with the resistor R4 are a capacitor C4 and a counter coil CC of a sensor or counter 20. The counter 20 per se is of the type commonly known in the art and is such that its contact 8 is attracted toward the counter coil CC in response to the exciting of the counter coil CC thereby turning on a relay circuit 9. As a result of the turn-on of the relay circuit 9, an alarm means such as a buzzer (not shown) is excited to alarm the flow of lightning current and/or follow current through the lightning arrester A. Further, each time the relay circuit 9 is turned on, a register (not shown) is actuated to register the number of times the alarm device 5 has operated within a predetermined period of time.

The operation of the first embodiment will be described. When, for example, the electric power line 1 is struck by lightning, the greater portion of lightning current flows through the resistor R4, while the greater portion of follow current flows through the inductive impedance element or coil L. This is because the coil L is selected to have most suitable inductance value taking into account the fact that the frequency of follow current is low, whereas that of lightning current is generally high. More precisely, there is the relation $Z_{AC} < Z_R < Z_{IMP}$ among the impedance $Z_R$ of the resistor R4 in the current conducting state, that $Z_{IMP}$ of the coil L with respect to the lightning current of high frequency, and that $Z_{AC}$ of the coil L with respect to the follow current of low frequency. The capacitor C4 is charged up with the drop voltage Va appearing across the resistor R4 due to the flow of the lightning current $I_{IMP}$ therethrough, and the counter coil CC is excited by the charges stored in the capacitor C4, resulting in the operation of the sensor or counter 20.

Figure 8:
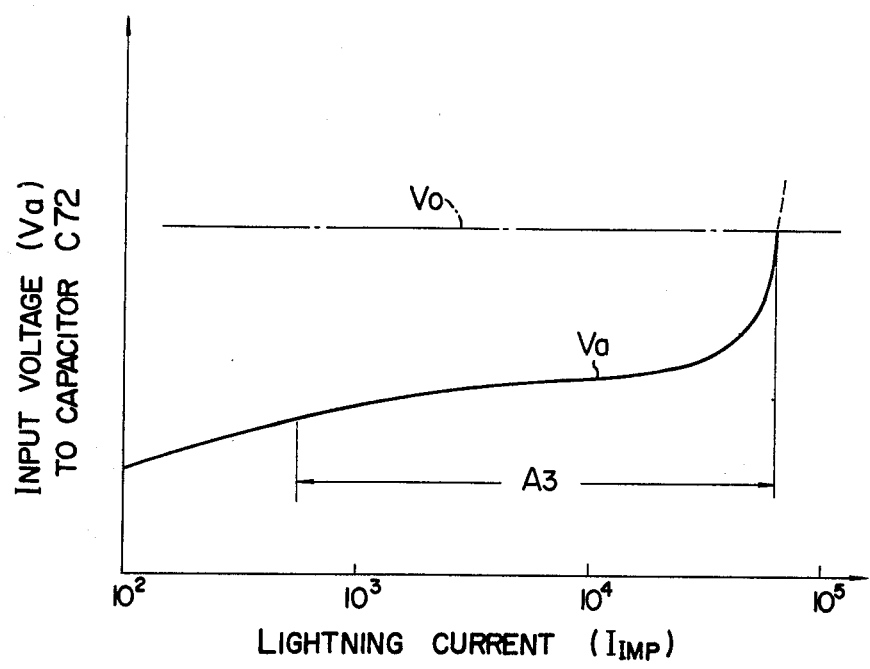
FIG. 8 is a graph showing forth embodiment of the present invention to illustrate how the voltage Va charging the capacitor C72 connected in parallel with the counter coil CC varies relative to the lightning current $I_{IMP}$.

It will be understood from the above description that the basic structure of the present invention comprises an earthed discharged current circuit connected between the earthed electrode of a lightning arrester or protective coordination gap and earth and comprising a non-linear resistor consisting essentially of zinc oxide connected in parallel with an inductive impedance element. By virtue of this basic structure, the present invention eliminates the aforementioned defects of the prior art device in which the operating current region of the counter is narrowed by being limited by the gap length of the air gap connected in parallel with the non-linear resistor. According to the basic structure of the present invention, the rate of increase in the drop voltage across the non-linear resistor can be kept very low in spite of the fact that the lightning current varying over a wide range in a large current region flows through the protective coordination gap. Thus, the operating current region of the counter can be greatly widened to cover from the mininum operating current level to the maximum input level Vo of the counter as seen in FIG. 8. The discharge current of the capacitor C4 is dependent substantially on the time constant determined by the capacitance of the capacitor C4 and the inductance of the counter coil CC. Therefore, the holding period of time of the counter 20, counter contact 8 and relay circuit 9 can be easily regulated by suitably varying the capacitance of the capacitor C4.

Figure 5:
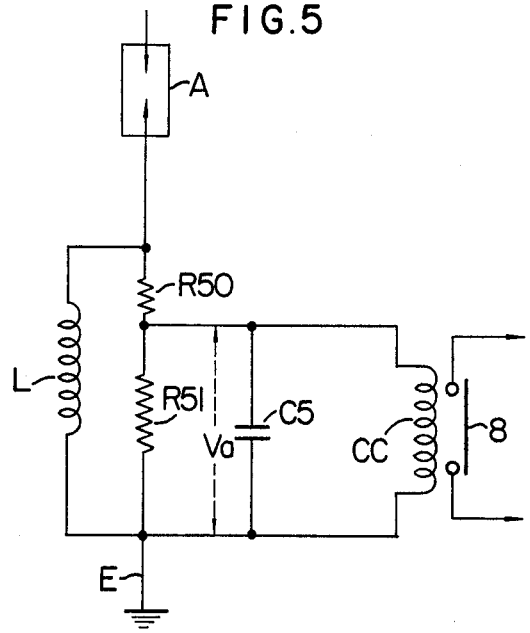

Referring to FIG. 5, there is shown a second embodiment of the present invention which is virtually a modification of the first embodiment shown in FIG. 4. This second embodiment differs from the first embodiment in that the non-linear resistor R4 is replaced by a pair of non-linear resistors R50 and R51, consisting essentially of zinc oxide, which are connected in series with each other and in parallel with the coil L, and instead of the capacitor C4, a capacitor C5 serving the same purpose and having the same function as the capacitor C4 is connected in parallel with the resistor R51. In FIG. 5, the same symbols and numerals are used to designate the same or like parts appearing in FIG. 4. In this second embodiment too, the aforementioned basic structure is provided by connecting the resistors R50 and R51 in parallel with the coil L to achieve the desired objects and effects as in the first embodiment. The resistor R50 has a resistance which is considerably lower than that of the resistor R51 and is provided for the current limiting purpose so that residual charges of the capacitor C5 may not wastefully pass through the resistor R50 and coil L, thereby further improving the response performance of the sensor or counter 20. The coil L may be connected in parallel with the resistor R51 only.

Figure 6:
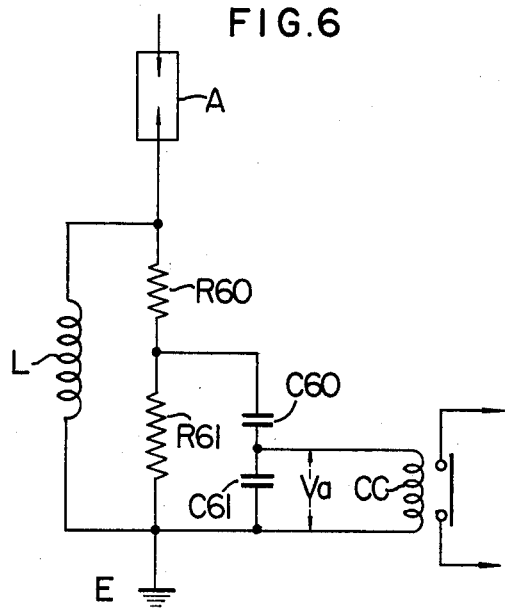

Referring to FIG. 6, there is shown a third embodiment of the present invention which is virtually a modification of the second embodiment shown in FIG. 5. The basic structure of this third embodiment comprises a pair of non-linear resistors R60 and R61 connected in series with each other and in parallel with the coil L. A pair of capacitors C60 and C61 are connected in series with each other and in parallel with the resistor R61, and the counter coil CC is connected in parallel with the capacitor C61. The basic structure of this third embodiment achieves also the desired objects and effects as in the preceding embodiments. In the third embodiment, the voltage input to the counter coil CC is divided by the resistor R61 and then by the capacitor C61. Therefore, the third embodiment provides such an economical advantage that the capacitors C60 and C61, counter 20 and counter coil CC need not be of high breakdown voltage and large current capacity. In this embodiment too, the coil L may be connected in parallel with the resistor R61 only.

Figure 7:
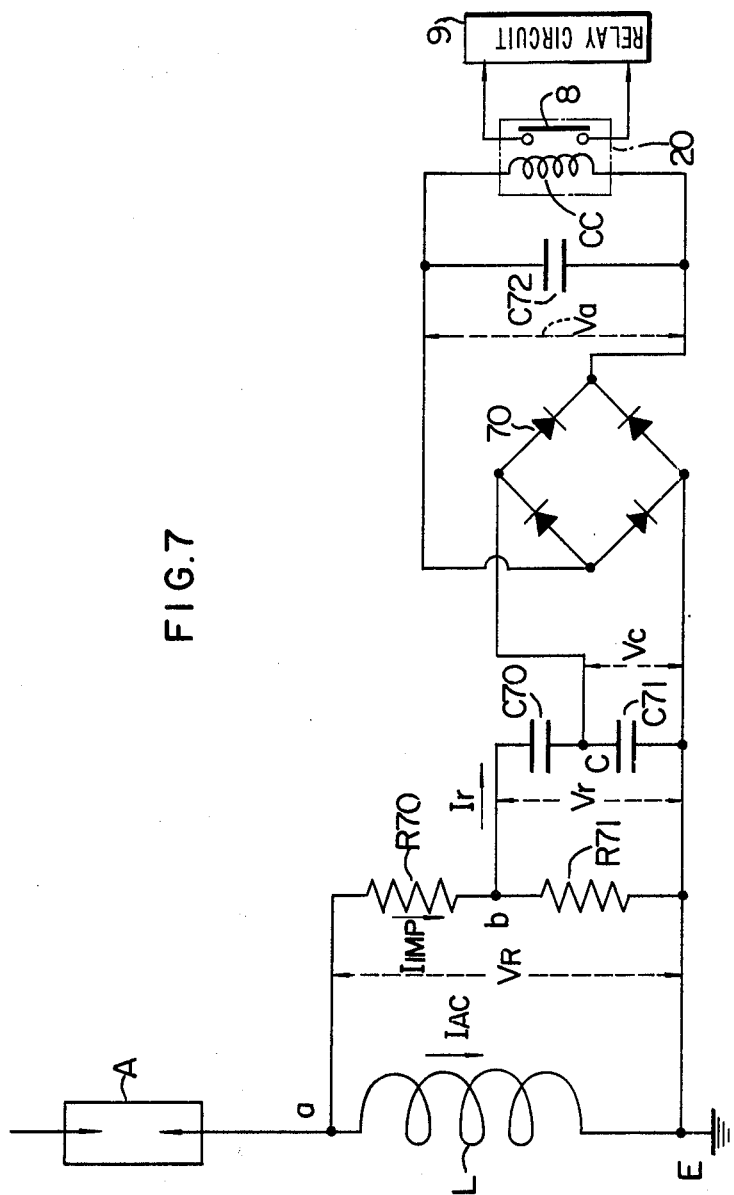

Referring to FIG. 7, there is shown a fourth embodiment of the present invention which is generally similar to the third embodiment shown in FIG. 6 except that a full-wave rectifier circuit is added to the latter. The basic structure of the fourth embodiment comprises a pair of non-linear resistors R70 and R71 connected in series with each other and in parallel with a coil L. A pair of capacitors C70 and C71 are connected in series with each other and in parallel with the resistor R71. A full-wave rectifier circuit 70 is connected across the capacitor C71 at its input side and across another capacitor C72 at its output side. The capacitor C72 is connected in parallel with a counter coil CC of a sensor or counter 20.

The operation of the fourth embodiment is similar to that of any one of the aforementioned embodiments. The drop voltage $V_R$ appearing across the non-linear resistors R70 and R71 in response to the flow of lightning current $I_{IMP}$ is divided by the resistor R71 to provide a voltage Vr which is applied across the series-connected capacitors C70 and C71, and the voltage Vc obtained by dividing Vr by the capacitor C71 is then rectified by the full-wave rectifier circuit 70 to provide the input voltage Va for the capacitor C72. According to this embodiment, the operating current region A3 of the counter 20 is very wide as illustrated by the characteristic curve in FIG. 8 due to the fact that the variation in the drop voltage Vr is limited to a very narrow range although the lightning current $I_{IMP}$ flowing through the non-linear resistors R70 and R71 consisting essentially of zinc oxide varies over a wide range in a large current region. The divided voltage output Vc of the capacitor C71 can also be easily regulated by suitably varying the capacitance of the capacitors C70 and C71, and the minimum operating current level of the counter 20 can also be freely selected. The voltage Vc can also be freely selected taking into account the breakdown voltage level of the rectifier circuit 70, capacitor C72 and counter coil CC. Further, due to the fact that the oscillating current, in addition to the unidirectional current, is rectified before being supplied to the capacitor C72, the counter 20 can be reliably operated even with arrival of the oscillating current. In this fourth embodiment too, the coil L may be connected in parallel with the resistor R71 only.

The operating voltage Va of the counter 20 is determined by the divided portion Ir of the lightning current $I_{IMP}$. The counter 20 is therefore free from mal-operation due to an externally induced surge, and the follow current $I_{AC}$ or like current appearing as a result of a direct hit by lightning can be safely conducted to earth through the coil L. Therefore, no change occurs in the operating conditions of the counter, and the operating performance of the counter against repeated operation can be greatly improved.

We claim:

1. A lightning current responsive alarm device connected between protective coordination gap means, across which discharge takes place in response to the application of a lightning stroke voltage, and earth for alarming the operation of said protective coordination gap means, said alarm device comprising:
   non-linear resistor means with a low voltage variation over a wide current range connected between said protective coordination gap means and earth,
   capacitor means connected to said non-linear resistor means so that it is charged up with the drop voltage appearing across said non-linear resistor means,
   sensor means operated by the discharge current of said capacitor, and
   impedance means connected in parallel with said non-linear resistor means for providing a low impedance against a low frequency, but a high impedance against a high frequency.

2. A lightning current responsive alarm device as claimed in claim 1, wherein said impedance means is an inductive impedance element.

3. A lightning current responsive alarm device as claimed in claim 1, wherein said impedance means is a coil.

4. A lightning current responsive alarm device as claimed in claim 1, wherein another resistor having a relatively low resistance value is connected between said protective coordination gap means and said non-linear resistor.

5. A lightning current responsive alarm device connected between protective coordination gap means, across which discharge takes place in response to the application of a lightning stroke voltage, and earth for alarming the operation of said protective coordination gap means, said alarm device comprising:
   non-linear resistor means with a low voltage variation over a wide current range including a non-linear resistor means having a relatively low resistance value and another non-linear resistor means having a relatively high resistance value connected in series with each other between said protective coordination gap means and earth,
   capacitor means connected to said non-linear resistor means of relatively high resistance so that it is charged up with the drop voltage appearing across said non-linear resistor of relatively high resistance,
   sensor means operated by the discharge current of said capacitor means, and
   inductive impedance means connected in parallel with said series-connected non-linear resistor means.

6. A lightning current responsive alarm device connected between protective coordination gap means, across which discharge takes place in response to the application of a lightning stroke voltage, and earth for alarming the operation of said protective coordination gap means, said alarm device comprising:

non-linear resistor means with a low voltage variation over a wide current range connected between said protective coordination gap means and earth, capacitor means including first and second capacitors connected in series with each other connected to said non-linear resistor means so that said first and second capacitors are charged up with the drop voltage appearing across said non-linear resistor means, sensor means having a counter coil with said counter coil connected in parallel to one of said series connected capacitors and operated by the discharge current of said parallel connected capacitor of said capacitor means, and inductive impedance means connected in parallel with said non-linear resistor means.

7. A lightning current responsive alarm device as claimed in claim 6, wherein said series-connected capacitors are connected in parallel with said non-linear resistor means.

8. A lightning current responsive alarm device as claimed in claim 6, wherein said non-linear resistor means is composed of a pair of non-linear resistors, connected in series with each other, and said series-connected capacitors are connected in parallel with said non-linear resistor which is earthed connected to earth at one of its terminals.

9. A lightning current responsive alarm device as claimed in claim 6, wherein another resistor means having a relatively low resistance value is connected between said protective coordination gap means and said non-linear resistor means.

10. A lightning current responsive alarm device connected between protective coordination gap means, across which discharge takes place in response to the application of a lightning stroke voltage, and earth for alarming the operation of said protective coordination gap means, said alarm device comprising:

non-linear resistor means with a low voltage variation over a wide current range connected between said protective coordination gap means and earth, capacitor means, sensor means with a counter coil operated by the discharge current of said capacitor means, inductive impedance means connected in parallel with said non-linear resistor means, and rectifier circuit means with its input connected in parallel with said non-linear resistance means, wherein said capacitor means and the counter coil of said sensor means are connected in parallel with the output of said rectifier circuit means so that said capacitor means is charged up by the output of said rectifier circuit means.

11. A lightning current responsive alarm device as claimed in claim 10, wherein second capacitor means is connected in parallel with said non-linear resistor.

12. A lightning current responsive alarm device as claimed in claim 10, wherein another resistor means having a relatively low resistance value is connected between said protective coordination gap means and said non-linear resistor means.

13. A lightning current responsive alarm device connected between protective coordination gap means, across which discharge takes place in response to the application of a lightning stroke voltage, and earth for alarming the operation of said protective coordination gap means, said alarm device comprising:

non-linear resistor means with a low voltage variation over a wide current range connected between said protective coordination gap means and earth and comprising a pair of resistor means connected in series with each other with a terminal of one of said resistor means connected to earth, first capacitor means, sensor means with a counter coil operated by the discharge current of said first capacitor means, inductive impedance means connected in parallel with said series-connected resistor means, a pair of series-connected second capacitor means connected in parallel with the said resistor means connected to earth at one of its terminals so that one terminal of one of said second capacitor means is connected to earth, and rectifier circuit means connected at its input in parallel with the one of said pair of series connected second capacitor means which is connected to earth, said first capacitor means and the counter coil of said sensor means being connected in parallel with the output of said rectifier circuit means so that said one of said pair of series connected second capacitor means which is connected to earth is charged by the output of said rectifier circuit means.

14. A lightning current responsive alarm device as claimed in claim 1, wherein said capacitor means is connected in parallel across said non-linear resistance means.

* * * * *